(12) United States Patent
Sakuyama et al.

(10) Patent No.: US 7,931,760 B2
(45) Date of Patent: Apr. 26, 2011

(54) WHISKERLESS PLATED STRUCTURE AND PLATING METHOD

(75) Inventors: Seiki Sakuyama, Kawasaki (JP); Kozo Shimizu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1011 days.

(21) Appl. No.: 11/473,014

(22) Filed: Jun. 23, 2006

(65) Prior Publication Data

US 2007/0218312 A1    Sep. 20, 2007

(30) Foreign Application Priority Data

Mar. 2, 2006 (JP) .................. 2006-056633

(51) Int. Cl.
B23K 31/00    (2006.01)
(52) U.S. Cl. ............ 148/536; 427/383.1; 427/375
(58) Field of Classification Search .................. None
See application file for complete search history.

(56) References Cited

U.S. PATENT DOCUMENTS

| | | | | |
|---|---|---|---|---|
| 5,780,172 A | * | 7/1998 | Fister et al. .................. | 428/647 |
| 2008/0316715 A1 | | 12/2008 | Fujii | |

FOREIGN PATENT DOCUMENTS

| | | |
|---|---|---|
| EP | 0 550 002 B1 | 7/1993 |
| JP | 05-033187 A | 2/1993 |
| JP | 11-135226 A | 5/1999 |
| JP | 2001-26898 A | 1/2001 |
| JP | 2002047593 A * | 2/2002 |
| JP | 3660798 * | 3/2005 |
| TW | 200605184 | 2/2006 |

OTHER PUBLICATIONS

English Machine Translation of JP 05-033187, Document Date: Feb. 9, 1993, Translation Date: Oct. 23, 2009.*
Glazunova et al., Reactive Diffustion At the Copper-Tin Boundry in Electrodeposition Coatings, Russian/Applied Chemistry, 1987.*
Glazunova et al., Reactive Diffustion At the Copper-Tin Boundry In Electrodeposition Coatings, Russian/Applied Chemistry, 1987 (English Translation, Aug. 2010).*
Kay et al., Barrier Layers Against Diffusion, Transactions of the Institute of Metal Finishing, vol. 57(4), 1979, pp. 169-174.*
Kensaku Mouri et al., "Development of Lead-Free Solder Plating", Kouchi-Ken Kogyo Gijutsu Center Research Report No. 34, 2003.

* cited by examiner

*Primary Examiner* — Jennifer C McNeil
*Assistant Examiner* — Adam C Krupicka
(74) *Attorney, Agent, or Firm* — Westerman, Hattori, Daniels & Adrian, LLP

(57) ABSTRACT

A plated structure is disclosed that includes a base formed of a copper-based material containing copper as a major component, a plating film formed of a tin-based material containing tin as a major component and provided over the base, and a tin-copper compound barrier film located at the boundary between the base and the plating film. The density of the tin-copper compound barrier film is greater than that of copper.

3 Claims, 5 Drawing Sheets

FIG.5

| | PLATING FILM 1 (μm) | Cu$_3$Sn THICKNESS (μm) | PLATING FILM 2 (μm) | # OF WHISKERS/Lmax (μm) |
|---|---|---|---|---|
| COMPARISON | 0.00 | 0.00 | 10 | 50 OR MORE/1000 μm |
| EXAMPLE 1 | 0.03 | 0.03 | 10 | 5/200 μm |
| EXAMPLE 2 | 0.05 | 0.05 | 10 | NO OBSERVED |
| EXAMPLE 3 | 1.0 | 1.0 | 10 | NO OBSERVED |
| EXAMPLE 4 | 2.0 | 2.0 | 10 | NO OBSERVED |
| EXAMPLE 5 | 2.7 | 2.7 | 10 | NO OBSERVED |
| EXAMPLE 6 | 3.0 | 2.9 | 10 | NO OBSERVED |
| EXAMPLE 7 | 3.5 | 3.0 | 10 | 37/400 μm |
| EXAMPLE 8 | 4.0 | 3.0 | 10 | 48/750 μm |

WHISKERLESS PLATED STRUCTURE AND PLATING METHOD

BACKGROUND OF THE INVENTION

1. Field of the Invention

The present invention generally relates to a plating technique, and more particularly, to a whiskerless and lead-free plated structure and plating method involving the formation of a tin-based plating coating used in place of a tin-lead (Sn—Pb) plating film.

2. Description of Related Art

Conventionally, tin-lead (Sn—Pb) solder plating is applied to metallic devices and components, such as connector terminals or lead frames for semiconductor integrated circuits. In recent years and continuing, however, lead-free plating has been discussed and studies are being conducted to perform lead-free plating in place of conventional tin-lead solder plating from the viewpoint of protection of the environment. Candidates for lead-free plating include leadless tin plating, tin-copper (Sn—Cu) alloy plating, tin-bismuth (Sn—Bi) alloy plating, and tin-silver (Sn—Ag) alloy plating. Japanese Patent Laid-Open Application Publication No. 2001-26898 discloses a tin-copper alloy plating method for forming a tin-copper alloy plating film containing 0.01 to 10.0 weight percent copper.

When a tin-based lead-free alloy (including the above-listed alloys) is used for a plating film, tin crystal whiskers are likely to grow depending on the types of plating alloys. Tin whiskers often cause electric failure or short-circuiting between adjacent electrodes. Because whiskers are as thin as 1 μm diameter and as long as 1000 μm or more, they are easily separated from the plating film. The dispersed whiskers cause further problems, including short-circuiting, in and outside devices.

One reason for the generation of whiskers is internal stress in a plating film. It is considered that whiskers grow during re-crystallization of tin under the application of internal stress.

This is explained in more detail with reference to FIG. 1. If a tin (Sn) or tin-alloy plating film 101 is applied onto a copper (Cu) or copper-alloy underlayer 100 (which underlayer is, for example, a lead frame or a plating film of the lead frame), then $Cu_6Sn_5$ intermetallic compound 102 is produced at the interface between the copper film 100 and the tin (or tin alloy) plating film 101. This $Cu_6Sn_5$ compound 102 grows greatly at the grain boundary and applies compression stress to the Sn plating film 101, which causes internal stress to be generated in the Sn plating film 101.

It is known that $Cu_6Sn_5$ expands cubically because its density is 8.3, which value is relatively small. Copper atoms constituting the underlayer Cu film 100 diffuse rapidly at the grain boundary of the tin (Sn) plating film 101, and cubically expansive $Cu_6Sn_5$ compound 102 is produced at the tin plating grain boundary. For this reason, the tin plating film 101 is subjected to compression stress. This compression stress applied to the inside of the tin plating film 101 acts as a driving force for generation of crystal whiskers, and consequently, long and needle-like whiskers are produced.

In general, whiskers may be prevented from growing by performing mat electrodeposition or semibright plating using plating solution with a greatly reduced amount of brightener agent to reduce the internal stress. Whiskers may also be prevented by applying a thermal process of about 150° C. after plating to reduce the stress.

In addition, it is proposed to form a diffusion barrier film from nickel or other suitable metals on the Cu or Cu-alloy underlayer (or base) to prevent growth of $Cu_6Sn_5$ and generation of whiskers. See, for example, Kensaku MOURI, Koutaro TAKEUCHI, and Yoshinori OMOTO, "Development of Lead-Free Solder Plating", Kouchi-Ken Kogyo Gijutsu Center Research Report No. 34, 2003.

However, the method of forming a diffusion barrier film causes another problem because a nickel plating film easily diffuses into a tin plating film. Due to this property, nickel separates out through the grain boundary and precipitates at the surface of the plating film. The nickel precipitate forms nickel oxide at the plating surface, which oxide greatly reduces solder wetness.

The former method for reducing internal stress by use of mat electrodeposition or semibright plating, or by application of a post-plating thermal process may reduce whiskers to a certain extent; however, the whisker prevention effect is insufficient.

SUMMARY OF THE INVENTION

Therefore, the invention may overcome the problems in the prior art and provide a whiskerless plated structure that can sufficiently prevent generation of whiskers and a method of forming such a plating film.

In an embodiment of the invention, a compound having a density greater than that of copper (which density is 8.9) is inserted between a base made of a copper-based material containing copper as the major component and a tin-based plating film containing tin as the major component. By providing a stable compound with less cubic expansion between the base and the tin-based plating film, generation of internal stress is prevented, and consequently, whiskers can be prevented.

A compound with a density greater than that of copper is, for example, $Cu_3Sn$ with density of 11.3. $Cu_3Sn$ is a material of high copper density, and a $Cu_3Sn$ barrier film can be formed by providing a tin or tin-alloy plating film (referred to as "tin-based plating film") of a specific range of thickness over copper or copper-alloy. For example, when a tin-based plating film with a thickness of 0.05 μm to 3.0 μm is formed, almost all the tin-based plating film can be changed efficiently into $Cu_3Sn$ barrier film.

The tin-based plating film can be formed by either electrolytic plating or electroless plating; however, electroless plating is preferable from the viewpoint of uniform formation of the plating film.

By applying a thermal process to the tin-based (including tin and tin-alloy) plating film with the above-described thickness at or above 100° C., a stable copper-tin compound (e.g., $Cu_3Sn$) barrier film can be formed at a higher rate. The temperature and the heating time can be appropriately selected for the desired growing rate of the compound.

In one aspect of the invention, a plated structure comprises
(a) a base formed of a copper-based material containing copper as a major component;
(b) a plating film formed of a tin-based material containing tin as a major component and provided over the base; and
(c) a tin-copper compound barrier film located at the boundary between the base and the plating film, wherein the density of the tin-copper compound barrier film is greater than that of copper.

In the preferred example, the thickness of the Cu—Sn compound barrier film is from 0.05 μm to 3.0 μm. An example of the Cu—Sn compound is $Cu_3Sn$.

In another aspect of the invention, a plating method is provided. The method comprises the steps of:

(a) forming a first plating film containing tin as a major component over a base formed of a copper-based material containing copper as a major component;
(b) forming a tin-copper compound barrier film from the first plating film, the tin-copper compound having a density greater than that of copper; and
(c) forming a second plating film containing tin as a major component over the tin-copper compound barrier film.

In the preferred example, the method may further comprise the step of:
(d) applying a thermal process to the first plating film at 100° C. to 150° C.

In the preferred example, substantially the entirety of the first plating film is changed into the tin-copper compound with the density greater than that of copper.

According to the above-described structure and method, whiskerless tin-based plating with a simple film structure can be realized, while maintaining satisfactory wetness with respect to solder.

BRIEF DESCRIPTION OF THE DRAWINGS

Other objects, features, and advantages of the present invention will become more apparent from the following detailed description when read in conjunction with the accompanying drawings, in which:

FIG. 5 is a table showing the assessment result of whisker prevention effect under various different conditions.

DETAILED DESCRIPTION OF THE PREFERRED EMBODIMENTS

The preferred embodiments of the present invention are described below with reference to the attached drawings.

Figure 1:
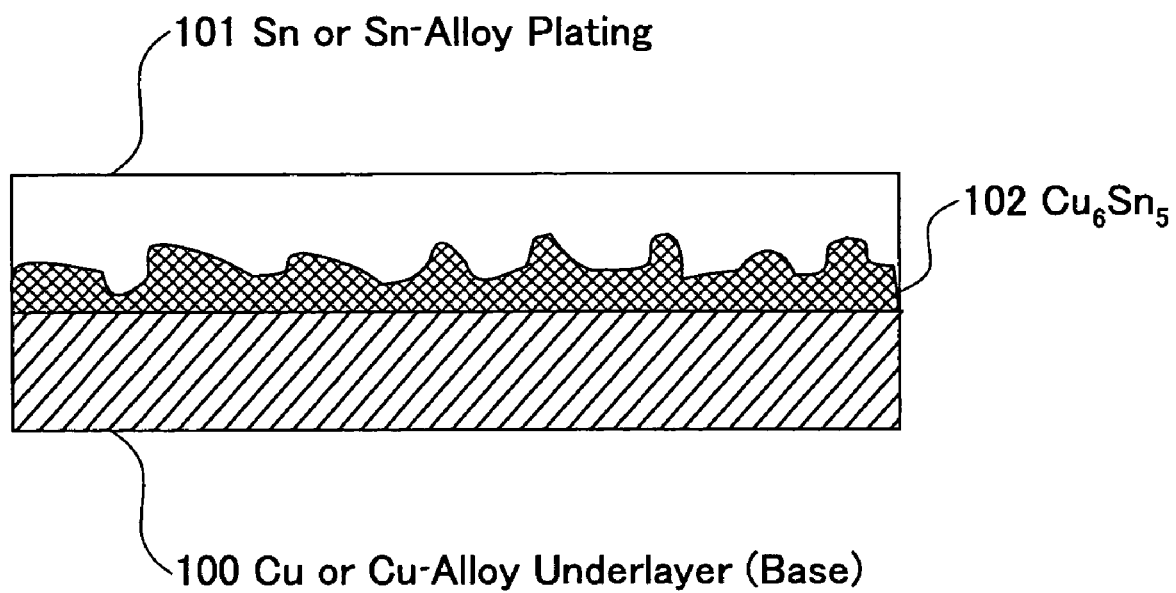
FIG. 1 is a schematic diagram used to explain a problem arising in a conventional tin-based plating film.
Figure 2A:
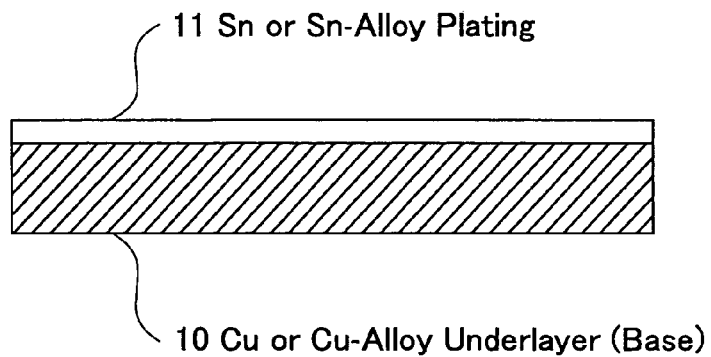
FIG. 2A through FIG. 2C illustrate a whiskerless plating process for forming a tin-based plating film according to an embodiment of the invention.
Figure 2B:
Figure 2C:
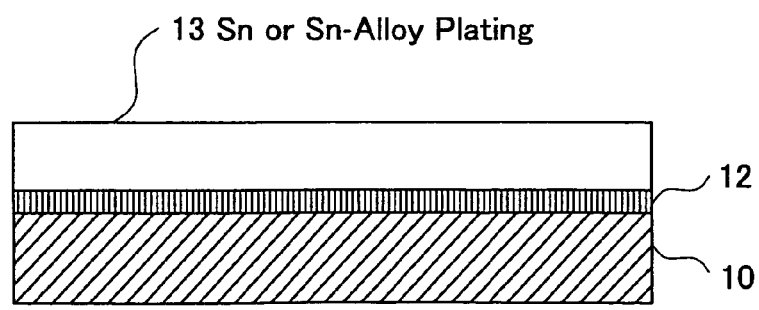

FIG. 2A through FIG. 2C illustrate in cross-sectional views a whiskerless plating process, including formation of a tin-based plating film, according to an embodiment of the invention. In FIG. 2A, a first tin or tin-alloy plating film (which is referred to as a "tin-based plating film") 11 is formed over a Cu or Cu-alloy base 10. The base 10 actually used in the experiment is a connector terminal of a 40-pin connector made of phosphor bronze. Prior to the tin-based plating, cathode electrolytic degreasing is performed as pretreatment on the base 10. The electrolytic degreasing agent is, for example, Cleaner 160 manufactured by Meltex Co., Ltd. In the embodiment, the pretreatment temperature is 65° C., the electric current density is 2.5 A/dm², and the pretreatment time is 30 seconds. After the electrolytic degreasing, the base 10 is rinsed by water.

Then, the base 10 is chemically polished using, for example, 50-percent CPB 40 manufactured by Mitsubishi Gas Chemical Company, Inc., as a polishing solution. The temperature of the polishing agent is room temperature, and immersion time is 20 seconds. After the chemical polishing, the base 10 is rinsed by water.

A tin (Sn) plating film is then formed over the base 10 by electroless deposition. Available electroless plating solution is, for example, 580MZ-05 manufactured by Ishihara Chemical Co., Ltd. The temperature of the plating solution is 70° C., and the Sn plating film 11 with a thickness of 3.0 µm is formed. In place of the pure tin plating film, a tin-alloy plating film may be formed. Tin plating film and tin-alloy plating film are collectively referred to as a tin-based plating film 11.

After the formation of the Sn plating film 11, water rinsing and acid activation are performed. In the acid activation, the sample (the tin-plated copper base) is immersed in a processing solvent of 10% sulfuric acid for 30 seconds at room temperature. Then, the sample is rinsed by water.

Then, as illustrated in FIG. 2B, a $Cu_3Sn$ barrier film 12 is formed by applying a thermal process to the structure shown in FIG. 2A at 100° C. for an hour. The thickness of the $Cu_3Sn$ barrier film 12 is the same as that of the Sn plating film 11. This means that almost all the Sn plating film 11 has changed into $Cu_3Sn$.

Then, as illustrated in FIG. 2C, a second tin (Sn) plating film 13, which is thicker than the first tin plating film 10, is formed over the $Cu_3Sn$ barrier film 12. Examples of the plating solution include 5% PF-ACID manufactured by Ishihara Chemical Co., Ltd. In this case, the plating temperature is room temperature, and the plating time is about 80 seconds. Under these conditions, a tin plating film 13 with a thickness of about 10 µm is formed.

Because the $Cu_3Sn$ Barrier film 12 is stable, formation of $Cu_6Sn_3$ can be prevented even if the $Cu_3Sn$ barrier film 12 is covered with the second tin plating film 13.

The tin plating film 13 may be replaced by a tin-alloy plating film, and in this case, the tin plating film and the tin-alloy plating film are collectively referred to as a tin-based plating film.

The plated structure shown in FIG. 2C has the $Cu_3Sn$ barrier film 12 at the interface between the Sn plating film 13 and the base 10 made of a Cu-based material containing copper as the major component. Because the density of the $Cu_3Sn$ barrier film 12 is greater than that of copper (Cu), internal stress due to cubic expansion of a reactive compound can be prevented, and consequently, whiskers can be prevented from being produced.

Although in the embodiment the crystal grains of the first plating film 11 and the second (thicker) plating film 13 are tin crystal grains, any suitable tin-alloys containing tin as the major component may be used. For example, tin-copper (Sn—Cu) alloy (with 2% copper) or tin-bismuth (Sn—Bi) alloy (with 2% bismuth) may be employed. To form a tin-copper (Ti—Cu) alloy plating film, Soft Alloy GTC-21 manufactured by Uyemura Kogyo Kabushiki Kaisya (C. Uyemura & Co., Ltd.) may be used as the plating solution. In this case, the plating conditions are 30° C. and electric current density of 3 A/dm². To form a tin-bismuth (Ti—Bi) alloy plating film, a mixture of plating solutions PF-TIN15, PF-BI15, and PF-ACID, all of which are manufactured by Ishihara Chemical Co., Ltd., may be used under the conditions of 25° C. and electric current density of 2 A/dm².

Figure 3:
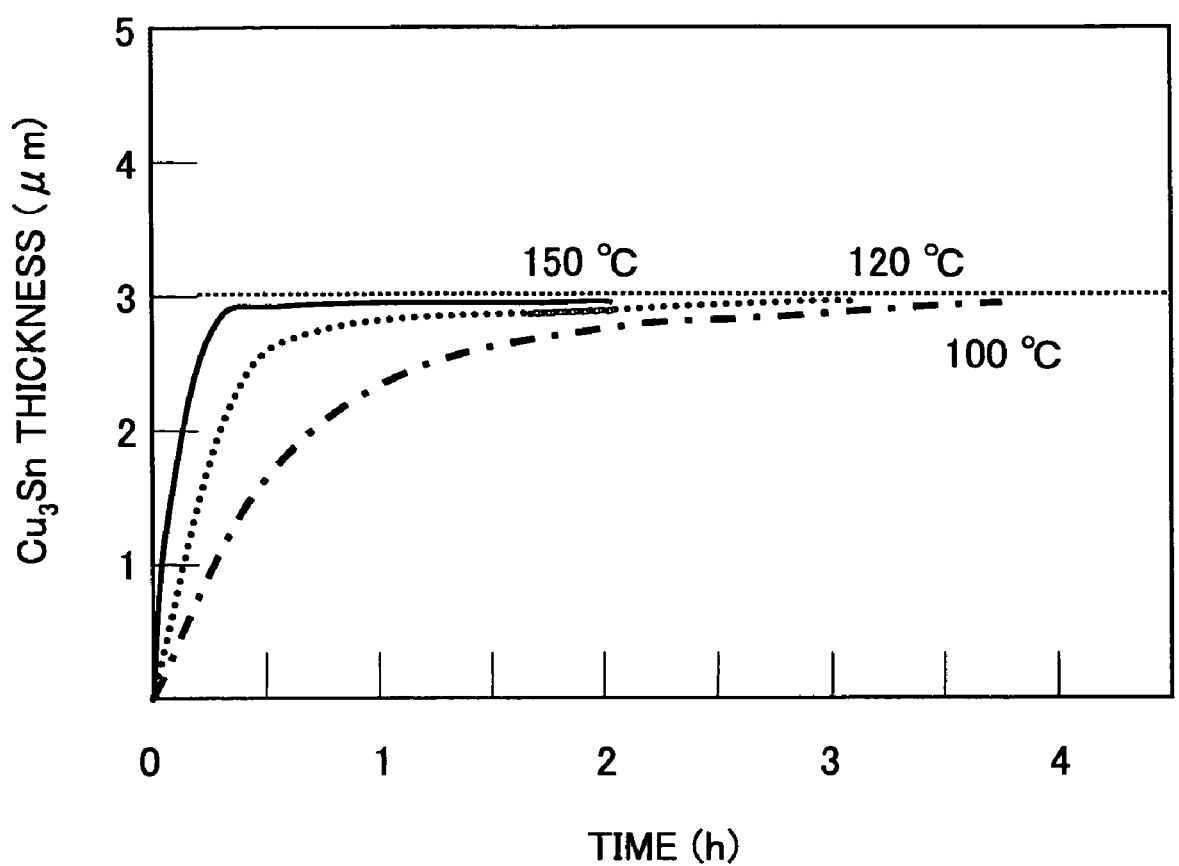
FIG. 3 is a graph showing growth of $Cu_3Sn$ barrier film through thermal treatment at various temperatures.

FIG. 3 is a graph showing the relationship between temperature of the thermal process and growing rate of the $Cu_3Sn$ barrier film 12. Samples were prepared by forming first Sn plating film 11 with a thickness of 3 µm over the base 10 according to the process shown in FIG. 2, while changing thermal process temperature to 100° C., 120° C., and 150° C. The curves in the graph represent thickness of the resultant $Cu_3Sn$ barrier film 12 as a function of time.

It is understood from the graph that applying the thermal process to the first Sn plating film 11 in the range from 100° C. to 150° C. can promote the growth of the $Cu_3Sn$ barrier film 12.

Figure 4:
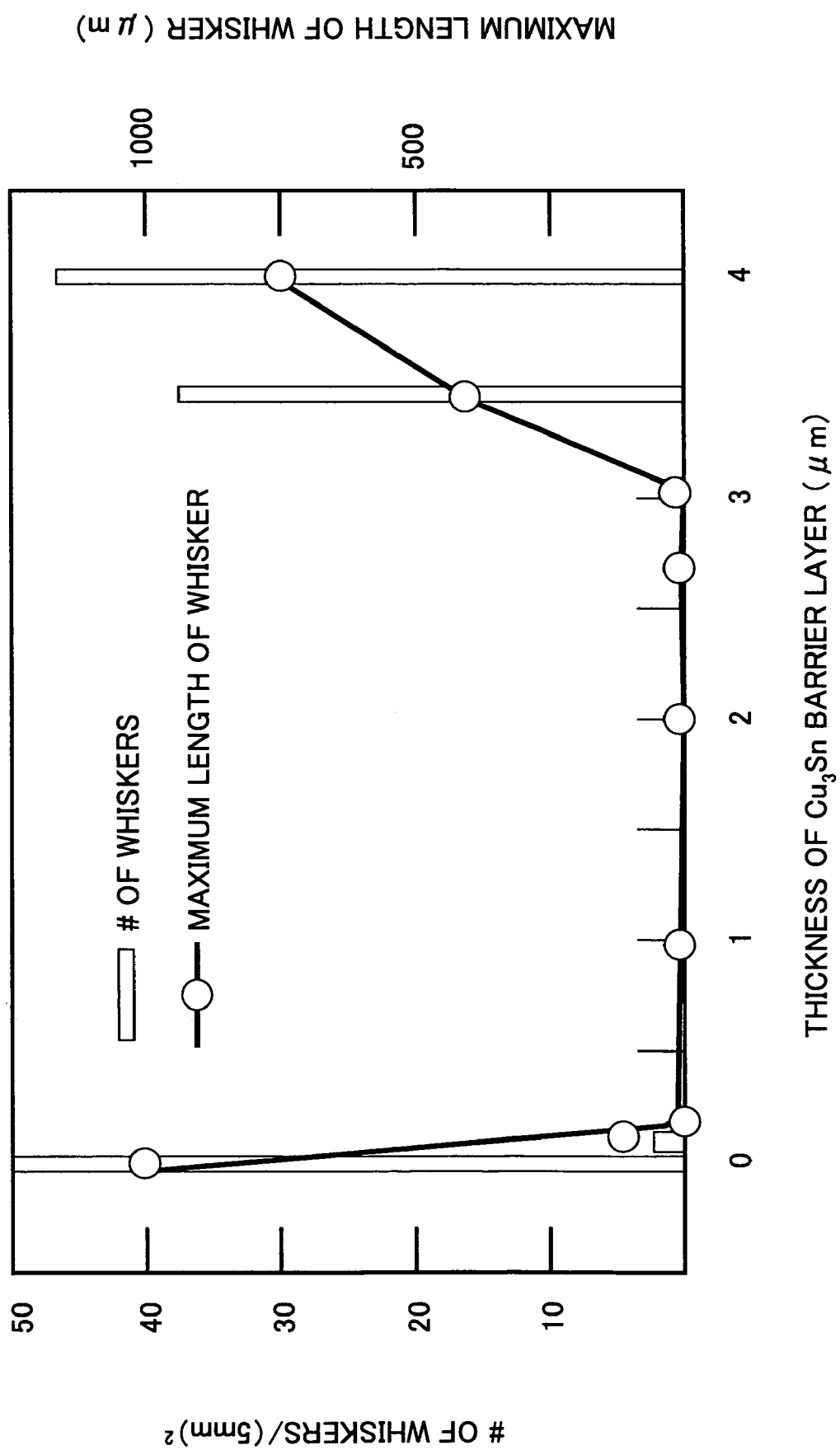
FIG. 4 is a graph showing the relationship between the number of whiskers observed and thickness of the $Cu_3Sn$ barrier film.

FIG. 4 is a graph showing the relationship between the thickness of the $Cu_3Sn$ barrier film 12 and the number of whiskers observed. To obtain this graph, the thickness of the first Sn plating film 11 formed over the phosphor bronze base 10 was varied from 0.03 μm to 4.0 μm by changing the electroless plating time from 10 seconds to 500 seconds, and samples with $Cu_3Sn$ barrier layer 12 with different thicknesses covered by second (or thicker) Sn plating film 13 were prepared. The number of whiskers generated per unit area of the second Sn plating film 13 was observed. The sample fabrication conditions are the same as those in the process of FIG. 2, except for the plating time and the thickness of the first Sn plating film 11. In addition, a conventional sample in which a Sn plating film 13 is formed directly over the phosphor bronze base 10 without the $Cu_3Sn$ barrier film 12 (i.e., without forming the first (thinner) Sn plating film 11 and without performing thermal process) was prepared for comparison. It should be noted that although $Cu_3Sn$ is not actually formed in the range beyond 3 μm in thickness along the horizontal axis of the graph, it is denoted as $Cu_3Sn$ thickness for the sake of convenience.

The prepared samples were left for 500 hours under the conditions of 60° C. and 93% RH. Then, the surfaces of the samples are first observed by a 100-power microscope, and when a whisker was found, detailed observation was made using a higher-power microscope.

FIG. 5 is a table showing the whisker observation result in association with the thickness of the first Sn plating film 11 and the thickness of the $Cu_3Sn$ barrier film 12. The number of whiskers with 5-μm-length or longer was counted in the 5 mm×5 mm unit area.

It is understood from FIG. 4 and FIG. 5 that almost all parts of the first Sn plating film 11 change to stable $Cu_3Sn$ barrier film 12 when the thickness of the first Sn plating film 11 is 0.05 μm to 3.0 μm and outbreak of whiskers is prevented effectively. If the first Sn plating film 11 is thinner than 0.05 μm, the barrier function of $Cu_3Sn$ cannot be sufficiently achieved. If the first Sn plating film 11 is thicker than 3.0 μm, $Cu_6Sn_3$ is likely to be produced.

To be more precise, with the comparison sample fabricated by the conventional method, 50 or more whiskers were observed, and the lengths of the produced whiskers are 1000 μm or more. It is considered that this phenomenon is due to cubically expansive $Cu_6Sn_3$ forming at the boundary between the base 10 made of a Cu-based material (e.g., phosphor bronze) and the 10-μm second tin plating film 13 and causing internal stress within the tin plating film 13.

When the first Sn plating film 11 formed over the base 10 is 0.03 μm thickness, the number of whiskers is greatly reduced; however, some whiskers are still observed. On the other hand, when the thickness of the first Sn plating film 11 is 3.5 μm, the first Sn plating film 11 cannot be entirely changed into the $Cu_3Sn$ barrier film 12, and $Cu_6Sn_3$ compound is formed of the remaining portion of the first Sn plating film 11, which compound causes whiskers to be produced.

When the thickness of the first Sn plating film 11 is ranging from 0.05 μm to 3.0 μm, almost all parts of the first Sn plating film 11 are changed into $Cu_3Sn$ barrier film 12, and few whiskers are observed.

Another experiment was performed using a lead frame plated according to the method of the embodiment. The plated lead frame was heated for 10 minutes at 150° C., and then solder was placed on the lead frame. It is confirmed that the plated lead frame shows excellent wetness with respect to solder.

Although in the embodiment a phosphor bronze base 10 is used, other materials and members may be included in the base to be plated. For example, a brass base may be coated with the plating structure shown in FIG. 2C, or a copper plating film covering a metallic device may serve as the underlayer or the base to be tin-plated. In either case, whiskers are prevented effectively and whiskerless plated structures can be achieved.

The plating method of the embodiment can be applied not only to lead frames, but also other electric devices and components including connector pins or terminals.

Although the present invention is explained based on the specific embodiment, the invention is not limited to the embodiment, and various applications and modifications can be made by those people with ordinary skill in the art without departing from the scope of the invention defined by the attached claims.

This patent application is based on and claims the benefit of the earlier filing dates of Japanese Patent Application No. 2006-056633 filed Mar. 2, 2006, the entire contents of which are incorporated herein by reference.

What is claimed is:

1. A plating method comprising:
    forming a first plating film with a thickness of 0.05 μm to 3.0 μm and containing tin as a major component over a base formed of a copper-based material containing copper as a major component;
    after the formation of the first plating film, performing water rinsing and acid activation on the first plating film;
    applying a thermal process to the first plating film at 100° C. to 150° C. after the acid activation to form a tin-copper compound barrier film from the first plating film, by changing over 96% of the thickness of the first plating film into the tin-copper compound barrier film consisting of $Cu_3Sn$; and
    forming a second plating film containing tin as a major component over the tin-copper compound barrier film.

2. The method of claim 1, wherein the first plating film is formed by electroless plating.

3. The method of claim 1, wherein the second plating film is formed by electroless plating.

* * * * *